(12) United States Patent
Seo et al.

(10) Patent No.: US 6,727,122 B2
(45) Date of Patent: Apr. 27, 2004

(54) METHOD OF FABRICATING POLYSILICON THIN FILM TRANSISTOR

(75) Inventors: Hyun-Sik Seo, Seoul (KR); Binn Kim, Seoul (KR); Jong-Uk Bae, Seoul (KR); Hae-Yeol Kim, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/310,975

(22) Filed: Dec. 6, 2002

(65) Prior Publication Data

US 2003/0180991 A1 Sep. 25, 2003

(Under 37 CFR 1.47)

(30) Foreign Application Priority Data

| Dec. 29, 2001 | (KR) | ......... | 2001-87728 |
| Dec. 29, 2001 | (KR) | ......... | 2001-87729 |
| Dec. 29, 2001 | (KR) | ......... | 2001-87730 |
| Dec. 29, 2001 | (KR) | ......... | 2001-87731 |

(51) Int. Cl.$^7$ ............................................. H01L 21/84
(52) U.S. Cl. ...................... 438/149; 438/151; 438/164; 438/166; 438/486; 438/491
(58) Field of Search ................................. 438/149, 151, 438/166, 486, 164, 491

(56) References Cited

U.S. PATENT DOCUMENTS 5,534,716 A * 7/1996 Takemura .................... 257/72

* cited by examiner

Primary Examiner—Jack Chen
(74) Attorney, Agent, or Firm—Morgan Lewis & Bockius LLP

(57) ABSTRACT

A method of forming a polycrystalline silicon active layer for use in a thin film transistor is provided. The method includes forming a buffer layer over a substrate, forming an amorphous silicon layer over the buffer layer, applying a catalytic metal to a surface of the amorphous silicon layer, crystallizing the amorphous silicon layer having the catalytic metal thereon into a polycrystalline silicon layer, forming an island pattern on the polycrystalline silicon layer, thereby defining an active region underneath in the polycrystalline silicon layer, applying n-type ions to the polycrystalline silicon layer and then heat-treating the polycrystalline silicon layer to remove the catalytic metal from the active region underneath the island pattern, patterning the polycrystalline silicon layer using the island pattern as a mask to form an active layer and to expose a surface of the adjacent buffer layer, removing the island pattern from the active layer using an etchant, and etching the exposed surface of the buffer layer when removing the island pattern.

38 Claims, 9 Drawing Sheets

METHOD OF FABRICATING POLYSILICON THIN FILM TRANSISTOR

This application claims the benefit of Korean Application Nos. 2001-87728, 2001-87729, 2001-87730, and 2001-87731, all filed on Dec. 29, 2001 in Korea, all of which are hereby incorporated by reference.

This application also incorporates by reference the following three (3) U.S. patent applications that are filed concurrently with the filing of the instant application:

(1) Application Ser. No. 10/310,965, filed Dec. 6, 2003, entitled "Method of Fabricating Polycrystalline Thin Film Transistor," of Inventors: Hyen-Sik SEO, Binn KIM, and Jong-Uk BAE;

(2) Application Ser. No. 10/310,964, filed Dec. 6, 2003, entitled "Method of Fabricating Polycrystalline Thin Film Transistor," of Inventors: Binn KIM, Jong-Uk BAE, and Hae-Yeol KIM; and (3) Application Ser. No. 10/310,966, filed Dec. 6, 2003, entitled "Method of Fabricating Polycrystalline Thin Film Transistor," of Inventors: Hyen-Sik SEO, Binn KIM, and Jong-Uk BAE.

BACKGROUND OF THE INVENTION

1. Field of the Invention

The present invention relates to a method of crystallizing amorphous silicon, and more particularly, to a method of fabricating a polycrystalline silicon thin film transistor (TFT). Although the present invention is suitable for a wide scope of applications, it is particularly suitable for improving electrical characteristics of the thin film transistor.

2. Discussion of the Related Art

In a conventional process for forming a polycrystalline silicon layer, an intrinsic amorphous silicon layer is formed on an insulating substrate by using a Plasma Chemical Vapor Deposition (PCVD) method or a Low Pressure Chemical Vapor Deposition (LPCVD) method. After the amorphous silicon layer has a thickness of about 500 Å (angstroms), it is re-crystallized into a polycrystalline silicon layer by using a crystallization method. The crystallization method is generally classified into one of an Excimer Laser Crystallization (ELC) method, a Solid Phase Crystallization (SPC) method, a Metal Induced Crystallization (MIC) method, and a Metal Induced Lateral Crystallization (MILC).

In the ELC method, an insulating substrate having an amorphous silicon layer formed thereon is heated to a temperature of about 250° C. An excimer laser beam is then applied to the amorphous silicon layer to form a polycrystalline silicon layer. In the SPC method, the amorphous silicon layer is heat-treated at a high temperature for a long time to be crystallized into a polycrystalline silicon layer. In the MIC method, a metal layer is deposited on the amorphous silicon layer and the deposited metal is used for crystallization. In the MIC method, a large-sized glass substrate can be used as an insulating substrate. In the MILC method, a metal is first formed on the amorphous silicon layer, and then the amorphous silicon layer is crystallized. Also in the MILC method, an oxide pattern is formed on a predetermined active portion of the amorphous silicon layer. The amorphous silicon layer becomes polycrystalline silicon by a lateral growth of grains.

The Excimer Laser Crystallization (ELC) method has also been used with some advantages in annealing amorphous silicon. The excimer laser allows areas of an amorphous silicon film to be exposed to very high temperatures for very short periods of time. Theoretically, this offers a possibility of annealing the amorphous silicon at an optimum temperature (less than 400 degrees Celsius) without degrading the underlying substrate upon which the silicon amorphous film is mounted. However, use of this method has been limited by the lack of control over some of the process steps. Typically, an aperture size of the laser is relatively small. Due to the aperture size, power of the laser, and thickness of the amorphous silicon film, multiple laser passes or shots may be required to complete an annealing process. Since it is difficult to precisely control the laser, the multiple shots introduce non-uniformities into the annealing process. Further, the substrates must be annealed serially in a furnace rather than simultaneously. As a result, TFTs made by the ELC method are significantly more expensive.

In the SPC method, a buffer layer is formed on a quartz substrate that can stand a temperature higher than 600° C. The buffer layer serves to prevent a contamination from the quartz substrate. Thereafter, an amorphous silicon layer is deposited on the buffer layer and is sufficiently heat-treated in a furnace at a high temperature so as to form a polycrystalline silicon layer. However, because the SPC method is performed at the high temperature for a long period of time, it is difficult to acquire a desired crystalline silicon phase.

In the process of SPC method, because the crystalline grains develop without a continuous directionality, the polycrystalline silicon layer may have an irregular surface. In a thin film transistor, a gate insulating layer covers the polycrystalline silicon layer. Therefore, if the polycrystalline silicon layer has an irregular surface, the gate insulating layer is also irregularly formed, thereby decreasing a breakdown voltage of the thin film transistor. In addition, the size of the polycrystalline silicon grains formed by the SPC method are very irregular, thereby deteriorating electrical characteristics of a device using the polycrystalline silicon layer. Furthermore, the quartz substrate used for the SPC method is very expensive, thereby increasing the fabrication costs.

Unlike the SPC method that uses an expensive quartz substrate, the MIC method and the MILC method may utilize a relatively inexpensive glass substrate for forming polycrystalline silicon. In the MIC method and the MILC method, however, metal impurities may remain in the polycrystalline silicon network, thereby deteriorating the quality of the polycrystalline silicon layer. To alleviate this residual impurity problem, the conventional art employs the following method, which will be described with reference to FIGS. 1A to 1C and 2A to 2E.

FIGS. 1A to 1C are perspective views illustrating process steps of forming a polycrystalline silicon layer according to the conventional art.

Referring to FIG. 1A, a buffer layer 12 and an amorphous silicon (a-Si:H) layer 4 are sequentially deposited on a substrate 10. The buffer layer 12 is silicon nitride ($SiN_x$) or silicon oxide ($SiO_2$), and prevents alkali substances included in the substrate 10 from spreading into the amorphous silicon layer 4. Thereafter, the amorphous silicon layer 4 is dehydrogenated by a heat-treatment.

Referring to FIG. 1B, a catalytic metal 16 is formed on the surface of the amorphous silicon layer 4. For the catalytic metal 16, Nickel (Ni), Lead (Pb) or Cobalt (Co) is preferably employed. An ion shower method, an ion doping method, a sputtering method or a chemical vapor deposition (CVD) method is employed for the formation of the catalytic metal 16. After forming the catalytic metal, the amorphous silicon layer 4 is heated and then converted into a polycrystalline silicon layer 15 as shown in FIG. 1C.

FIGS. 2A to 2E are cross-sectional views illustrating process steps of forming a thin film transistor having a polycrystalline silicon layer according to the conventional art.

Referring to FIG. 2A, a buffer layer 2 is first formed on the substrate 10. Thereafter, a polycrystalline silicon layer is formed on the buffer layer 2 using the process mentioned with reference to FIGS. 1A to 1C, and then patterned to form an island-shaped active layer 8.

Referring to FIG. 2B, a gate insulation layer 11 is formed on the buffer layer 2 to cover the active layer 8. The gate insulation layer 11 is made of silicon nitride ($SiN_x$), silicon oxide ($SiO_2$) or Tetra Ethoxy Silane (TEOS), for example. Thereafter, a gate electrode 12 is formed on the gate insulation layer 11 and over the active layer 8. The active layer 8 is divided into two areas: a first active area 14 that is an intrinsic silicon area, and second active areas 16 and 17 wherein impurity ions are to be doped. The second active areas 16 and 17 are positioned on respective sides of the first active area 14. After forming the gate electrode 12 over the active layer 8, n-type ions (e.g. phosphorus ions) are doped onto the second active areas 16 and 17. Since the gate electrode 12 is disposed above the first active area 14 and acts as an ion stopper, the dopant, such as n-type ions, is not doped into the first active area 14.

This ion doping is performed to remove residual metal remaining in the island-shaped active layer 8, especially in the first active area 14. During the activation process after ion-doping, the residual catalytic metal left in the first active area 14 beneath the gate electrode 12 diffuses out from the first active area 14 towards the second active areas 16 and 17, and then reacts with the doped ions. In addition, a product resulting from the reaction of the catalytic metal and the doped ions flows out to and accumulates in the interfaces between the gate insulation layer 11 and the second active areas 16 and 17. Therefore, when the gate insulation layer 11 is etched out except a portion between the first active area 14 and the gate electrode 12 after the annealing process, the residual catalytic metal can be removed.

FIG. 2C shows a step of performing an ion-doping process after etching the gate insulation layer 11. As shown in FIG. 2C, a dopant, such as p-type ions, is doped into the second active areas 16 and 17 to form source and drain regions. In this ion-doping process, the gate electrode 12 also serves as an ion-stopper that prevents the p-type ion dopant from penetrating into the first active area 14. The first active area 14 is an intrinsic silicon region, whereas the second active areas 16 and 17 are doped silicon regions. The first active area 14 is centered between the second active areas 16 and 17. The gate insulation layer 111 and the gate electrode 12 are sequentially disposed on the first active area 14.

The above-mentioned dopant includes a group III element, such as boron (B). For example, $B_2H_6$ is used as the dopant. After the ion doping is finished, the doped portions 16 and 17 of the island-shaped active layer 8 become a p-type semiconductor.

Referring to FIG. 2D, an interlayer insulator 18 is formed to cover the gate electrode 12, the first active area 14, and the second active areas 16 and 17. A source contact hole 16a and a drain contact hole 17a are formed through the interlayer insulator 18, thereby exposing the second active areas 16 and 17, respectively. The second active areas 16 and 17 are source and drain regions on which source and drain electrodes are formed, respectively.

Referring to FIG. 2E, a source electrode 20 and a drain electrode 22 are formed on the interlayer insulator 18. The source and drain electrodes 20 and 22 electrically contact the source and drain regions 16 and 17, respectively, through the respective source and drain contact holes 16a and 17a. This completes a thin film transistor T having p-type polycrystalline silicon source and drain regions.

Thereafter, a passivation layer 26 is formed to cover the source and drain electrodes 20 and 22, and then patterned to form a pixel contact hole 27 that exposes a potion of the drain electrode 22. On the surface of the passivation layer 26, a transparent conductive material is deposited and then patterned to form a pixel electrode 28. Thus, the pixel electrode 28 formed on the passivation layer 26 electrically contacts the drain electrode 22 through the pixel contact hole 27.

In the conventional process of fabricating the polycrystalline silicon TFT, n-type ions are doped onto the polycrystalline silicon layer and then the annealing process is performed to remove the residual catalytic metal. However, although the gate insulation layer formed on the polycrystalline silicon layer is etched out to remove the residual catalytic metal after the annealing process, n-type ions may remain in the second active areas of the polycrystalline silicon layer which the source and drain electrodes contact. Therefore, when p-type ions are doped into the second active areas in a later step, quite complicated process parameters need to be adjusted considering the residual n-type ions, thereby introducing complexities in the process. In addition, the polycrystalline silicon TFT may be deteriorated, if the doping condition is not adequately controlled and adjusted to meet the optimal overall performance when p-type ions are doped.

SUMMARY OF THE INVENTION

Accordingly, the present invention is directed to a method for fabricating a polycrystalline silicon thin film transistor that substantially obviates one or more of the problems due to limitations and disadvantages of the related art.

An advantage of the present invention is to provide a method for fabricating a polycrystalline silicon thin film transistor, which effectively removes a residual catalytic metal from a polycrystalline silicon layer.

Another advantage of the present invention is to provide a method of fabricating a polycrystalline silicon thin film transistor, which prevents n-type ion dopant from remaining in a polycrystalline silicon layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of forming a polycrystalline silicon active layer for use in a thin film transistor. The method includes forming a buffer layer over a substrate; forming an amorphous silicon layer over the buffer layer; applying a catalytic metal to a surface of the amorphous silicon layer; crystallizing the amorphous silicon layer having the catalytic metal thereon into a polycrystalline silicon layer; forming an island pattern on the polycrystalline silicon layer, thereby defining an active region underneath in the polycrystalline silicon layer; applying n-type ions to the polycrystalline silicon layer and then heat-treating the polycrystalline silicon layer to remove the catalytic metal from the active region underneath the island pattern; patterning the polycrystalline silicon layer using the island pattern as a mask to form an active layer and to expose a surface of the adjacent buffer layer; removing the island pattern from the active layer using an etchant; and etching the exposed surface of the buffer layer to remove residual catalytic metal left on the buffer layer. The step of removing the island pattern may include dry-etching the island pattern, and the step of etching the exposed surface of the buffer layer may include wet-etching the exposed surface of the buffer layer to remove residual catalytic metal left on the buffer layer after the dry etching. The step of applying a catalytic metal may include forming dots of the catalytic metal on the surface of the amorphous silicon layer. When the catalytic metal is nickel (Ni), crystallizing the amorphous silicon layer may include reacting nickel (Ni) with silicon to form silicide ($NiSi_2$). In addition, crystallizing the amorphous silicon layer may include applying heat to the amorphous silicon layer. The catalytic metal may be lead (Pb) or cobalt (Co), for example. In the present example, the buffer layer and the island pattern may include at least one of silicon oxide and silicon nitride. When the n-type ions are phosphorous ions, heat-treating the polycrystalline silicon layer may include reacting the phosphorus ions with the catalytic metal. Heat-treating the polycrystalline silicon layer may include diffusing the catalytic metal out of the active region and reacting the catalytic metal with the n-type ions. Etching the exposed surface of the buffer layer may includes forming a first buffer layer portion underneath the active layer and a second buffer layer portion on the remaining substrate, and wherein the first buffer layer portion is thicker than the second buffer layer portion. The above-mentioned etchant may include hydrogen fluoride (HF) and slightly etches the exposed surface of the buffer layer.

In another aspect, the present invention provides a method of forming a polycrystalline silicon thin film transistor. The method includes forming a buffer layer over a substrate; forming an amorphous silicon layer over the buffer layer; applying a catalytic metal to a surface of the amorphous silicon layer; crystallizing the amorphous silicon layer having the catalytic metal thereon into a polycrystalline silicon layer; forming an island pattern on the polycrystalline silicon layer, thereby defining an active region underneath in the polycrystalline silicon layer; applying n-type ions to the polycrystalline silicon layer and then heat-treating the polycrystalline silicon layer to remove the catalytic metal from the active region underneath the island pattern; patterning the polycrystalline silicon layer using the island pattern as a mask to form an island-shaped active layer and to expose a surface of the adjacent buffer layer; removing the island pattern from the surface of the island-shaped active layer using an etchant; etching the exposed surface of the buffer layer to remove residual catalytic metal on the buffer layer; sequentially forming a first insulation layer and a metal layer on the etched buffer layer to cover the island-shaped active layer; patterning the first insulation layer and the metal layer using a single mask to form a gate insulation layer on the first active layer of the island-shaped active layer and to form a gate electrode on the gate insulation layer thereby defining a first active area underneath the gate insulating layer and exposed second active areas in the island-shaped active layer; applying a dopant to the second active areas of the island-shaped active layer to form source and drain regions on respective sides of the first active area; forming a second insulation layer to cover the gate electrode and the source and drain regions; forming source and drain contact holes in the second insulation layer to expose portions of the source region and the drain region, respectively; and forming source and drain electrodes, the source electrode contacting the source region through the source contact hole, and the drain electrode contacting the drain region through the drain contact hole. The step of removing the island pattern may include dry-etching the island pattern, and the step of etching the exposed surface of the buffer layer may include wet-etching the exposed surface of the buffer layer to remove residual catalytic metal left on the buffer layer after the dry etching. The step of applying a catalytic metal may include forming dots of the catalytic metal on the surface of the amorphous silicon layer. When the catalytic metal is nickel (Ni), crystallizing the amorphous silicon layer may include reacting nickel (Ni) with silicon to form silicide ($NiSi_2$). In addition, crystallizing the amorphous silicon layer may include applying heat to the amorphous silicon layer. The catalytic metal may be lead (Pb) or cobalt (Co), for example. The buffer layer and the island pattern may include at least one of silicon oxide and silicon nitride. The first insulation layer may include at least one of silicon oxide, silicon nitride and tetra ethoxy silane (TEOS). When the n-type ions are phosphorous ions, heat-treating the polycrystalline silicon layer may include reacting the phosphorus ions with the catalytic metal. Heat-treating the polycrystalline silicon layer may include diffusing the catalytic metal out of the active region and reacting the catalytic metal with the n-type ions. Applying a dopant to the second active areas of the island-shaped active layer may include doping with a $B_2H_6$ gas to the second active areas to form p-type source and drain regions. Etching the exposed surface of the buffer layer may include forming a first buffer layer portion underneath the active layer and a second buffer layer portion on the remaining substrate, and wherein the first buffer layer portion is thicker than the second buffer layer portion. The above-mentioned etchant may include hydrogen fluoride (HF) and slightly etches the exposed surface of the buffer layer. Furthermore, in the above aspects of the present invention, etching the exposed surface of the buffer layer includes extending an etching time for removing the island pattern to about 20% longer than a time period required for substantially removing the island pattern.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the similar reference numbers will be used throughout the drawings to refer to the same or like parts.

FIGS. 3A to 3F are perspective views illustrating sequential process steps of forming a polycrystalline silicon layer according to an embodiment of the present invention.

Figure 1A:
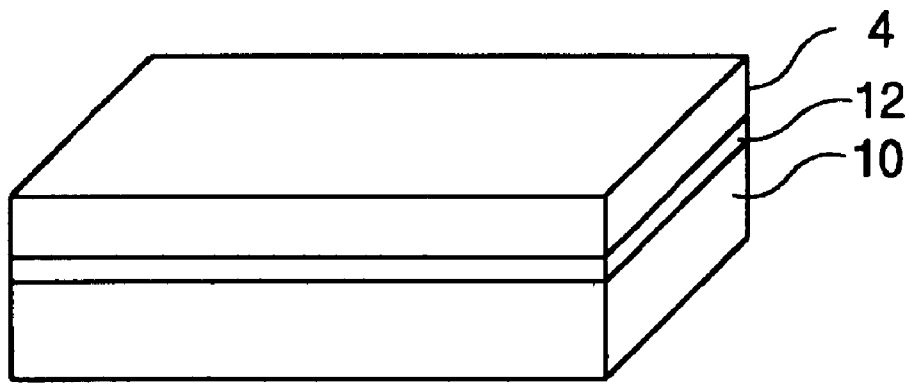
FIGS. 1A to 1C are perspective views illustrating process steps of forming a polycrystalline silicon layer according to the conventional art.
Figure 1B:
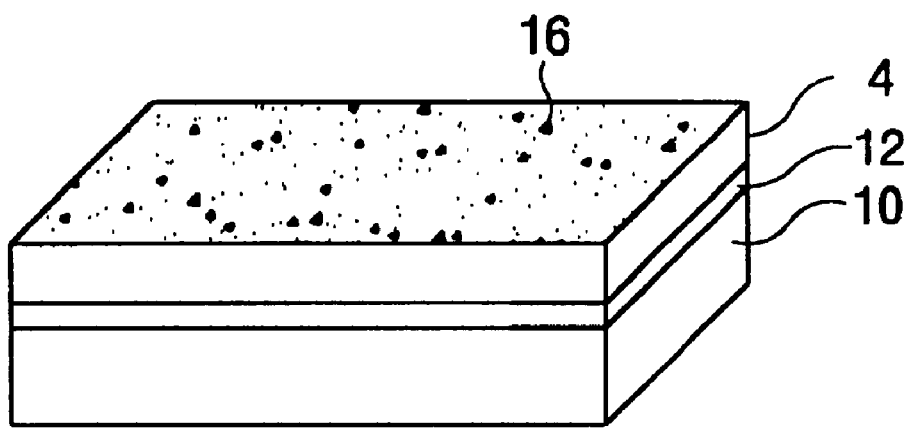
Figure 1C:
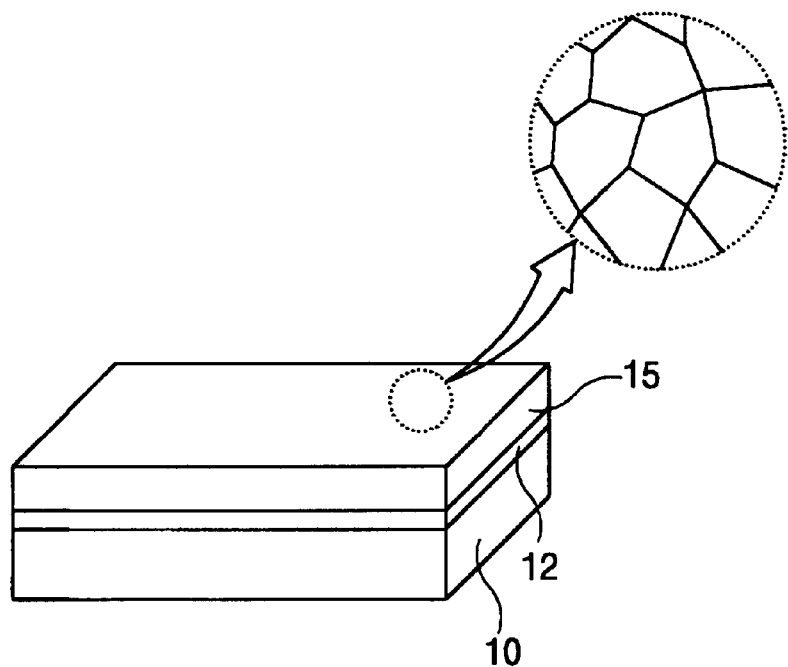
Figure 2A:
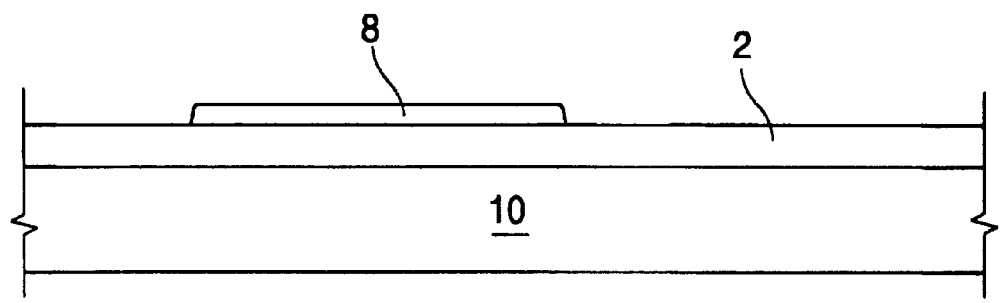
FIGS. 2A to 2E are cross-sectional views illustrating process steps of forming a thin film transistor using a polycrystalline silicon layer according to the conventional art.
Figure 2B:
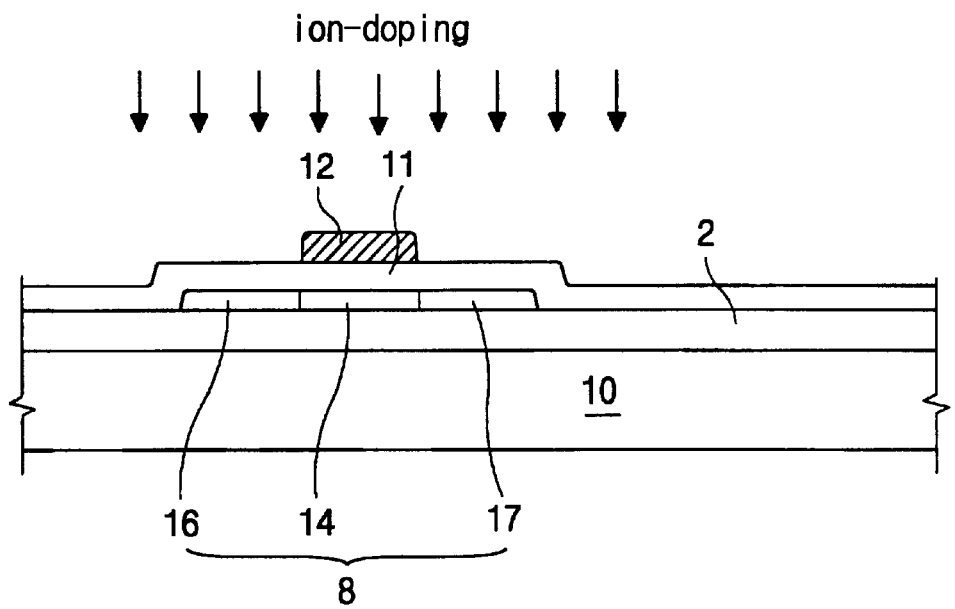
Figure 2C:
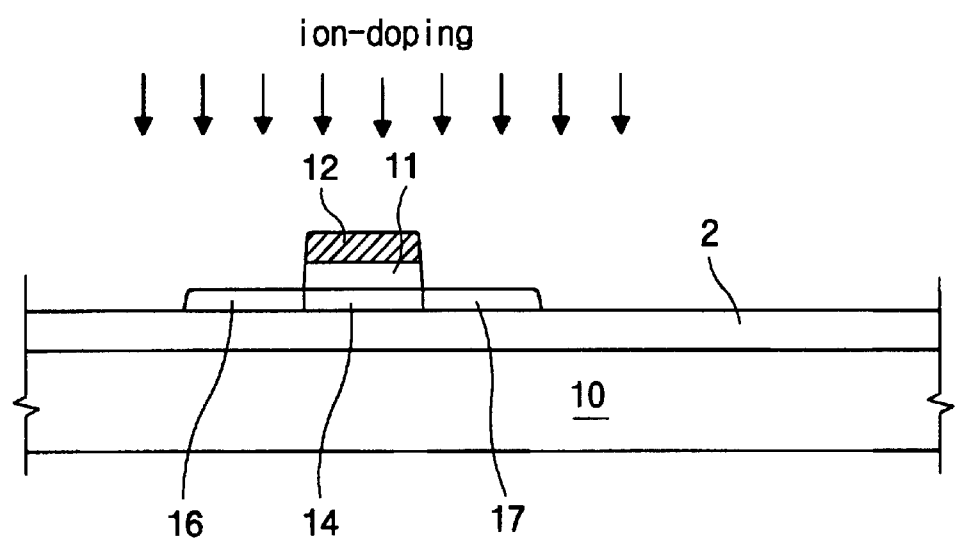
Figure 2D:
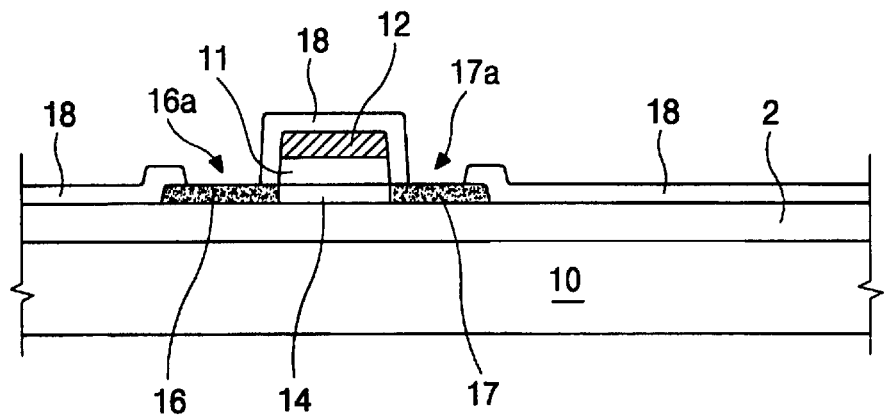
Figure 2E:
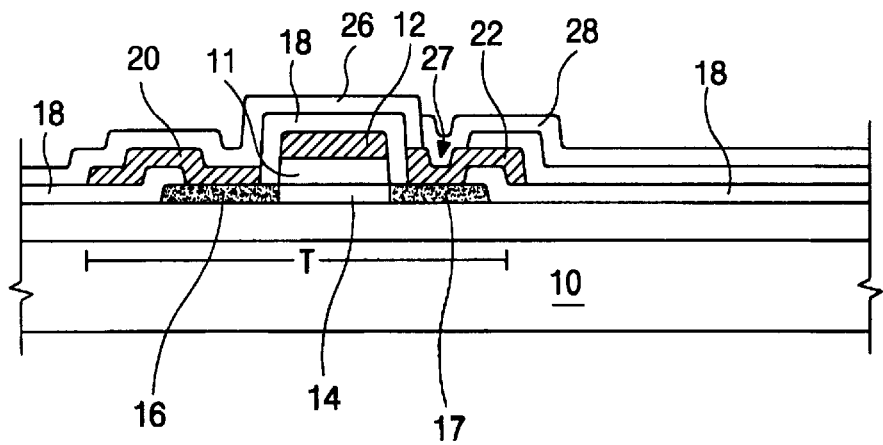
Figure 3A:
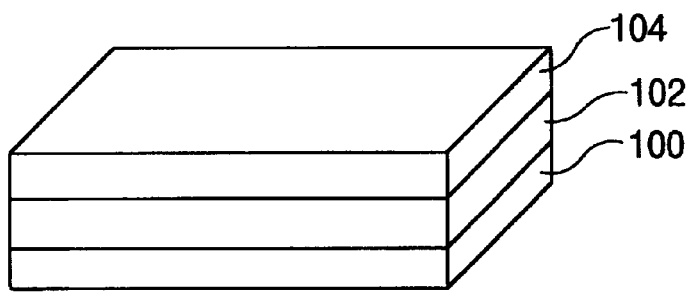
FIGS. 3A to 3F are perspective views illustrating sequential process steps of forming a polycrystalline silicon layer according to an embodiment of the present invention.

Referring to FIG. 3A, a buffer layer 102 is first formed on a substrate 100. The buffer layer 102 is preferably silicon nitride ($SiN_x$) or silicon oxide ($SiO_x$), for example. Then, an amorphous silicon layer 104 is formed on the buffer layer 102. Here, the buffer layer 102 prevents alkali substances and the like included in the substrate 100 from spreading into the amorphous silicon layer 104.

Figure 3B:
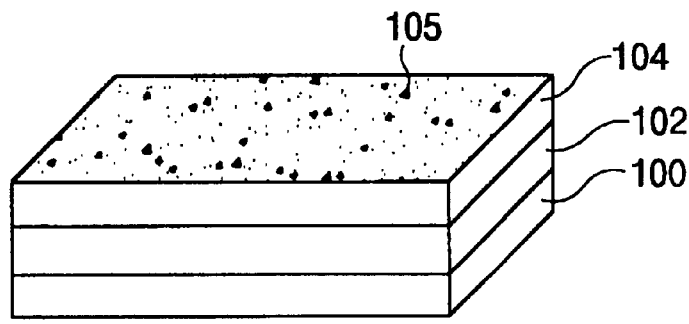
Figure 3C:
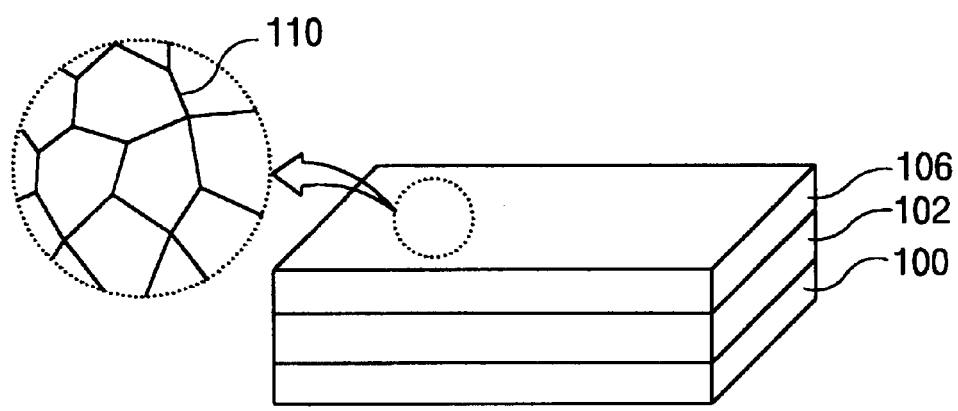

Referring to FIG. 3B, a catalytic metal 105 is applied to the surface of the amorphous silicon layer 104. The catalytic metal 105 on the amorphous silicon layer 104 may be in the form of dots or the like. Nickel (Ni), Lead (Pb), Cobalt (Co) or the like is preferably employed for the catalytic metal 105. When applying heat to the amorphous silicon layer 104 having the catalytic metal 105 thereon, silicon of the amorphous silicon layer 104 reacts with the catalytic metal 105 at the surface of the amorphous silicon layer 104, thereby forming silicide ($NiSi_2$). The resulting silicide diffuses into the interior of the amorphous silicon layer 104 and helps convert the amorphous silicon layer 104 of FIG. 3B into a polycrystalline silicon layer 106 of FIG. 3C. The resulting polycrystalline silicon layer 106 has a large number of grains 110 therein, as shown in FIG. 3C.

In forming the catalytic metal 105 on the amorphous silicon layer before crystallization, an ion shower method, an ion doping method, a sputtering method or a chemical vapor deposition (CVD) method may be employed.

Figure 3D:
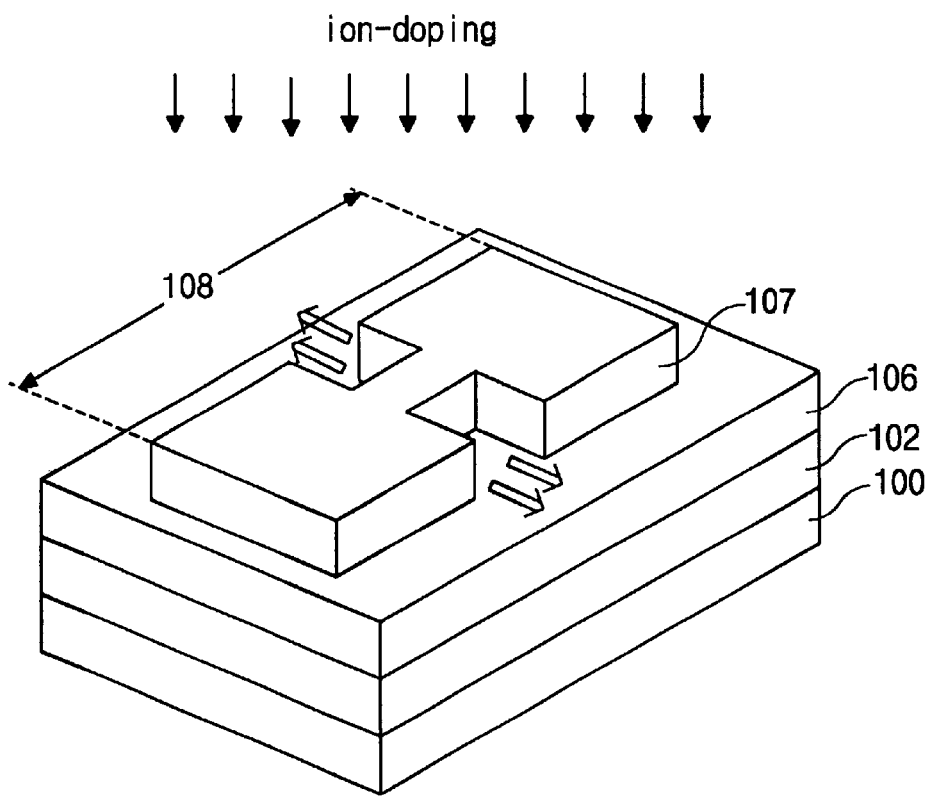

Referring to FIG. 3D, an island pattern 107 is formed on the polycrystalline silicon layer 106. The island pattern 107 has an H-shape that is the same shape as an active layer to be formed in a later step. That is, the island pattern 107 defines an active layer (or active region) 108 in the polycrystalline silicon layer 106 (FIG. 3E).

After forming the island pattern 107 on the polycrystalline silicon layer 106, n-type ions are doped onto the polycrystalline silicon layer 106. Then, a heat treatment is applied to the doped polycrystalline silicon layer 106 in order to eliminate the residual metal from the active region 108 of the polycrystalline silicon layer 106. During the heat treatment, the metal left in the active region 108 diffuses out from the interior to the exposed polycrystalline silicon area, and reacts with the n-type ion dopant. That is, the residual catalytic metal underneath the island pattern 107 diffuses by the heat treatment, and then produces a metal compound in the exposed area of the polycrystalline silicon layer 106. If the catalytic metal is nickel (Ni) and the dopant is phosphorus (P), Ni reacts with P and produces NiP in the exposed silicon area during the heat treatment. The dosage of the n-type ions is, for example, within a range of about $1 \times 10^{18}$ atoms/cm$^3$ to about $3 \times 10^{21}$ atoms/cm$^3$. The dosage of the n-type ions can be determined such that the subsequent heat treating removes substantially all catalytic metal from the active region 108 underneath the island pattern 107. In using ion implantation for the doping, a preferred acceleration voltage is within a range of about 5 keV to about 30 keV.

Figure 3E:
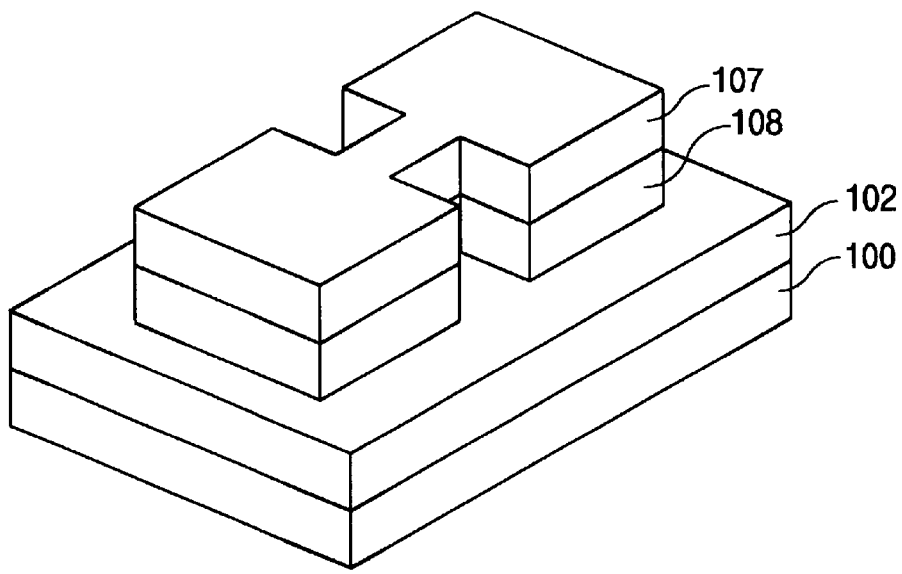

Referring to FIG. 3E, the polycrystalline silicon layer 106 is patterned using the island pattern 107 as a mask to form the active layer 108 underneath the island pattern 107.

Figure 3F:
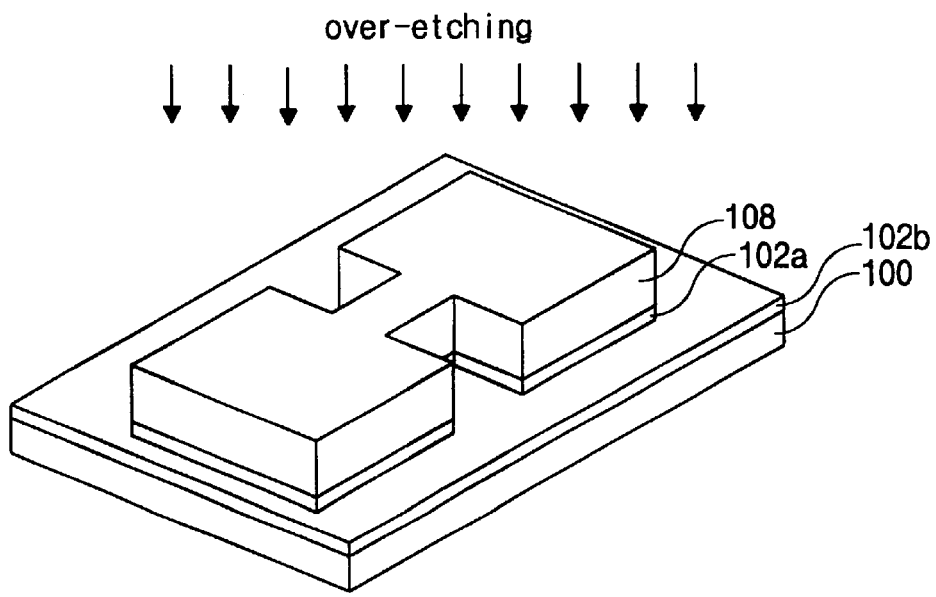

Thereafter, the island pattern 107 is removed from the active layer 108 using an etchant, as shown in FIG. 3F. In this example, the etchant for removing the island pattern 107 of FIG. 3E includes hydrogen fluoride (HF). At the time of removing the island pattern 107, the etchant is kept for about 20% longer than a time period required for substantially removing the island pattern so that the buffer layer 102 is over-etched. Since the buffer layer 102 is over-etched during the removal of the island pattern 107, a first buffer layer portion 102a having the same pattern shape is formed underneath the active layer 108, and a second buffer layer portion 102b is formed on the whole surface of the substrate 100.

When doping the n-type ions on the polycrystalline silicon layer 106 and then heat-treating the doped polycrystalline silicon layer 106, as illustrated in FIG. 3D, the metal compound of the residual catalytic metal and n-type ion dopant is formed not only in the exposed area of the polycrystalline silicon layer 106, but also in the interface between the polycrystalline silicon layer 106 and the buffer layer 102. If the metal compound exists on the surface of the buffer layer 102, it causes leakage current in a thin film transistor formed later. Therefore, in the present invention, the buffer layer 102 is slightly over-etched while removing the island pattern 107 to remove any metal compound that exists on the surface of the buffer layer 102.

Further, when a dry etching process is used for removing the island pattern 107, a wet etching process may be used for removing the residual catalytic metal (and any compounds thereof) left on the buffer layer 102. Often, a dry etching process has a directionality (e.g., vertical directionality) in etching. Because of this, if the residual catalytic metal (and any compounds thereof) remains on the buffer layer, portions of the buffer layer that are directly under the residual catalytic metal cannot be properly etched out, creating an undesirable rough surface profile. A wet-etching method generally do not have such a directional etching property. Thus, the subsequent wet etching can remove such portions of the buffer layer, and thus can remove the residual catalytic metal, thereby providing a smother surface profile.

FIGS. 4A to 4D are cross-sectional views illustrating sequential process steps of forming a thin film transistor using a polycrystalline silicon layer according to an embodiment of the present invention.

Figure 4A:
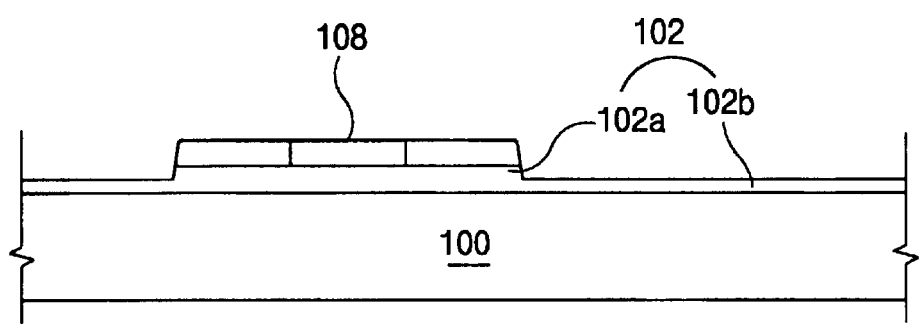
FIGS. 4A to 4D are cross-sectional views illustrating sequential process steps of forming a thin film transistor using a polycrystalline silicon layer according to the embodiment of the present invention.

FIG. 4A shows a cross-sectional view of FIG. 3F and illustrates the active layer 108 that is formed according to the present invention. As mentioned before, the buffer layer 102 is first formed on the substrate 100, and then, the active layer 108 is formed on the buffer layer 102 by the process illustrated in FIGS. 3A to 3F. As mentioned before, the buffer layer 102 is over-etched so that it is divided into a first buffer layer portion 102a and the second buffer layer portion 102b. The first buffer layer portion 102a is disposed underneath the active layer 108 and has a step relative to the second buffer layer portion 102b due to an over-etching of the buffer layer. The first buffer layer portion 102a is thicker than the second buffer layer portion 102b. The buffer layer 102 is provided to protect the active layer 108 from alkali substances and the like, which may be generated from the substrate 100 during subsequent processes.

Figure 4B:
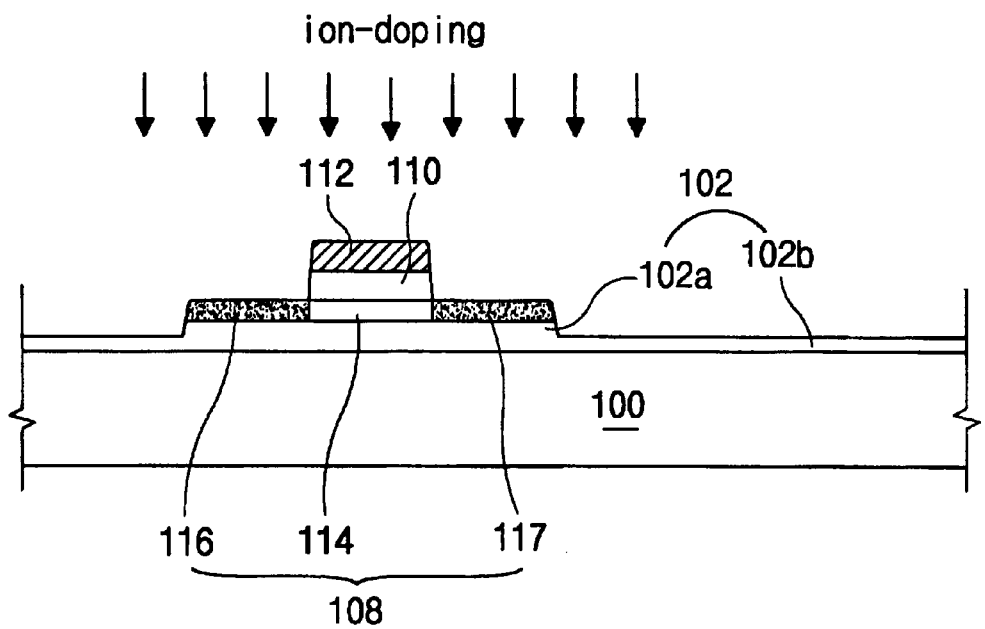

Referring to FIG. 4B, a gate insulation layer 110 and a gate electrode 112 are formed on the active layer 108 to define a first active area 114 underneath and second active areas 116 and 117 at the respective sides. To reduce the mask process, the gate insulation layer 110 and the gate electrode 112 are formed using the same mask, and thus, have the same pattern shape on the first active area 114. That is, after forming an insulating layer and a metal layer on the second buffer layer portion 102b and on the active layer 108, these layers are patterned using the same mask to form the gate insulation layer 110 and the gate electrode 112 over the first active area 114. In the present example, the buffer layer 102 and the gate insulation layer 110 may be made of silicon oxide ($SiO_2$), silicon nitride ($SiN_x$), or tetra ethoxy silane (TEOS), for example.

Thereafter, an ion doping is carried out by injecting a dopant, such as p-type ions, into the active layer 108. Since the gate electrode 112 severs as an ion stopper, the first active area 114 remains as an intrinsic silicon region, whereas the second active areas 116 and 117 become doped silicon regions. That is, the second active areas 116 and 117 become source and drain regions, respectively. If the doping uses, for example, $B_2H_6$ gas that includes a Group III element, doped portions of the active layer 108, i.e., the second active areas 116 and 117, become a p-type semiconductor.

Figure 4C:
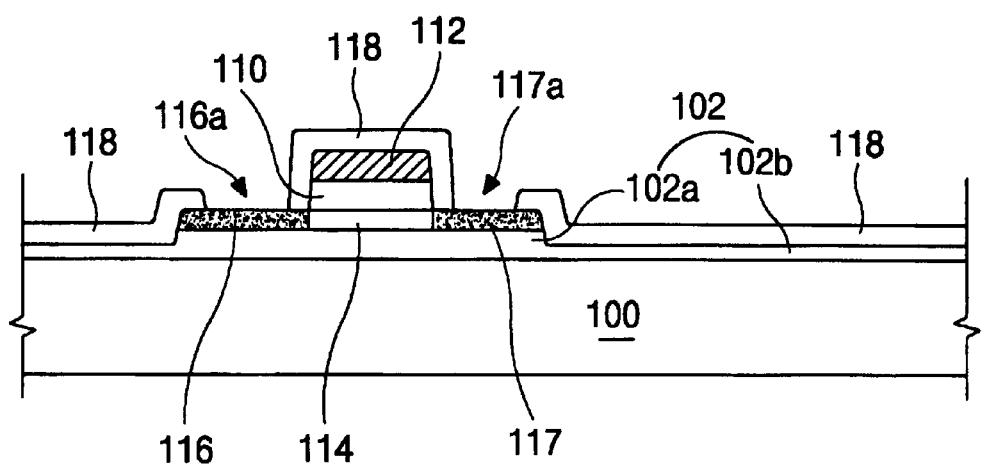

Referring to FIG. 4C, an interlayer insulating layer 118 is formed on the buffer layer 102 to cover the gate electrode 112, the gate insulation layer 110, and the source and drain regions 116 and 117. A source contact hole 116a and a drain contact hole 117a are formed in the interlayer insulating layer 118 to expose portions of the source and the drain regions 116 and 117, respectively.

Figure 4D:
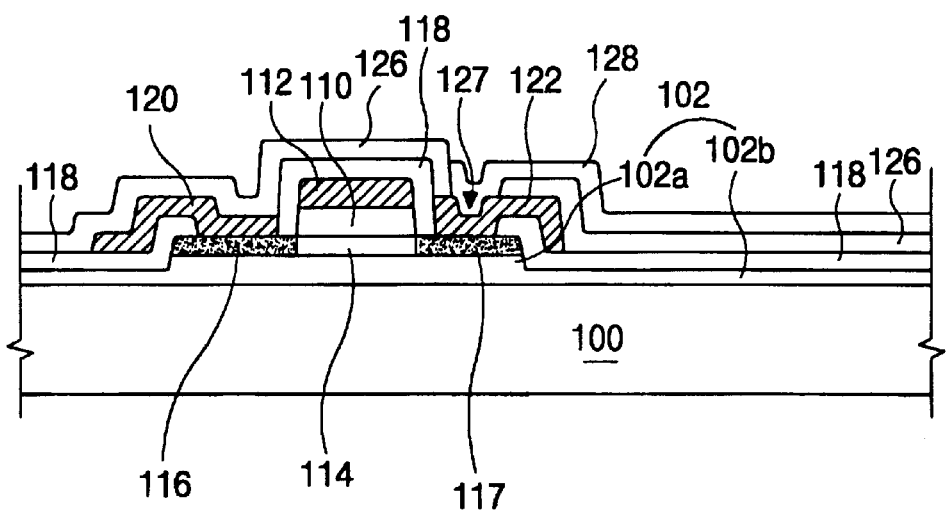

Referring to FIG. 4D, a source electrode 120 and a drain electrode 122 are formed on the interlayer insulating layer 118. The source and the drain electrode 120 and 122 electrically contact the source and the drain regions 116 and 117, respectively, through the respective source and drain contact holes 116a and 117a. Thereafter, a passivation layer 126 is formed to cover the source electrode 120 and the drain electrode 122, and then patterned to form a pixel contact hole 127 therein, thereby exposing a portion of the drain electrode 122. Thereafter, a transparent conductive material, for example, indium tin oxide or indium zinc oxide, is formed on the passivation layer 126 and then patterned to form a pixel electrode 128. The pixel electrode 128 electrically contacts the drain electrode 122 through the pixel contact hole 127.

In the above-described method for fabricating the polycrystalline silicon TFT according to the present invention, the island pattern having the same shape as the active layer is formed on the polycrystalline silicon layer in advance of doping the dopant into the polycrystalline silicon layer. During the heat treatment, the residual catalytic metal is removed from the active portion of the polycrystalline silicon layer underneath the island pattern. The n-type ion dopant is not doped onto the active layer due to the island pattern thereon. Therefore, the doping condition can easily be controlled when the p-type ions are doped into the source and drain regions of the active layer, thereby achieving the optimal doping performance and increasing the yield of thin film transistor.

Furthermore, since the surface of the buffer layer is slightly over-etched when removing the island pattern from the active layer, the metal compound of the catalytic metal and the dopant, which is left on the buffer layer, can be removed. Accordingly, the method of the present invention effectively eliminates the residual catalytic metal from the active layer and sufficiently removes the metal compound from the buffer layer, thereby preventing the leakage current in the thin film transistor. Furthermore, malfunction of the polycrystalline silicon thin film transistor due to such contamination can be prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of forming a polycrystalline silicon active layer for use in a thin film transistor, comprising:

forming a buffer layer over a substrate;

forming an amorphous silicon layer over the buffer layer;

applying a catalytic metal to a surface of the amorphous silicon layer;

crystallizing the amorphous silicon layer having the catalytic metal thereon into a polycrystalline silicon layer;

forming an island pattern on the polycrystalline silicon layer, thereby defining an active region underneath in the polycrystalline silicon layer;

applying n-type ions to the polycrystalline silicon layer and then heat-treating the polycrystalline silicon layer to remove the catalytic metal from the active region underneath the island pattern;

patterning the polycrystalline silicon layer using the island pattern as a mask to form an active layer and to expose a surface of the adjacent buffer layer;

removing the island pattern from the active layer using an etchant; and etching the exposed surface of the buffer layer to remove residual catalytic metal left on the buffer layer.

2. The method of claim 1, wherein removing the island pattern includes dry-etching the island pattern, and wherein etching the exposed surface of the buffer layer includes wet-etching the exposed surface of the buffer layer to remove residual catalytic metal left on the buffer layer after the dry etching.

3. The method of claim 1, wherein applying the catalytic metal includes forming dots of the catalytic metal on the surface of the amorphous silicon layer.

4. The method of claim 1, wherein the catalytic metal is nickel (Ni).

5. The method of claim 4, wherein crystallizing the amorphous silicon layer includes reacting nickel (Ni) with silicon to form silicide ($NiSi_2$).

6. The method of claim 5, wherein crystallizing the amorphous silicon layer includes applying heat to the amorphous silicon layer.

7. The method of claim 1, wherein the catalytic metal is lead (Pb) or cobalt (Co).

8. The method of claim 1, wherein the buffer layer includes at least one of silicon oxide and silicon nitride.

9. The method of claim 1, wherein the island pattern includes at least one of silicon oxide and silicon nitride.

10. The method of claim 1, wherein the n-type ions are phosphorous ions.

11. The method of claim 10, wherein heat-treating the polycrystalline silicon layer includes reacting the phosphorus ions with the catalytic metal.

12. The method of claim 1, wherein heat-treating the polycrystalline silicon layer includes diffusing the catalytic metal out of the active region and reacting the catalytic metal with the n-type ions.

13. The method of claim 1, wherein etching the exposed surface of the buffer layer includes forming a first buffer layer portion underneath the active layer and a second buffer layer portion on the remaining substrate, and wherein the first buffer layer portion is thicker than the second buffer layer portion.

14. The method of claim 1, wherein the etchant used in removing the island pattern etches the exposed surface of the buffer layer.

15. The method of claim 14, wherein the etchant includes hydrogen fluoride (HF).

16. The method of claim 1, wherein etching the exposed surface of the buffer layer includes extending an etching time for removing the island pattern to about 20% longer than a time period required for substantially removing the island pattern.

17. The method of claim 1, wherein the dosage of the n-type ions in the step of applying the n-type ions to the polycrystalline silicon layer is such that the subsequent heat treating removes substantially all catalytic metal from the active region underneath the island pattern.

18. The method of claim 1, wherein the dosage of the n-type ions is within a range of about $1 \times 10^{18}$ atoms/cm$^3$ to about $3 \times 10^{21}$ atoms/cm$^3$.

19. A method of forming a polycrystalline silicon thin film transistor, comprising
forming a buffer layer over a substrate;
forming an amorphous silicon layer over the buffer layer;
applying a catalytic metal to a surface of the amorphous silicon layer;
crystallizing the amorphous silicon layer having the catalytic metal thereon into a polycrystalline silicon layer;
forming an island pattern on the polycrystalline silicon layer, thereby defining an active region underneath in the polycrystalline silicon layer;
applying n-type ions to the polycrystalline silicon layer and then heat-treating the polycrystalline silicon layer to remove the catalytic metal from the active region underneath the island pattern;
patterning the polycrystalline silicon layer using the island pattern as a mask to form an island-shaped active layer and to expose a surface of the adjacent buffer layer;
removing the island pattern from the surface of the island-shaped active layer using an etchant;
etching the exposed surface of the buffer layer to remove residual catalytic metal left on the buffer layer;
sequentially forming a first insulation layer and a metal layer on the etched buffer layer to cover the island-shaped active layer;
patterning the first insulation layer and the metal layer using a single mask to form a gate insulation layer on the island-shaped active layer and to form a gate electrode on the gate insulation layer thereby defining a first active area underneath the gate insulating layer and exposed second active areas in the island-shaped active layer;
applying a dopant to the second active areas of the island-shaped active layer to form source and drain regions on respective sides of the first active area;
forming a second insulation layer to cover the gate electrode and the source and drain regions;
forming source and drain contact holes in the second insulation layer to expose portions of the source region and the drain region, respectively; and
forming source and drain electrodes, the source electrode contacting the source region through the source contact hole, and the drain electrode contacting the drain region through the drain contact hole.

20. The method of claim 19, wherein removing the island pattern includes dry-etching the island pattern, and
wherein etching the exposed surface of the buffer layer includes wet-etching the exposed surface of the buffer layer to remove residual catalytic metal left on the buffer layer after the dry etching.

21. The method of claim 19, wherein applying the catalytic metal includes forming dots of the catalytic metal on the surface of the amorphous silicon layer.

22. The method of claim 19, wherein the catalytic metal is nickel (Ni).

23. The method of claim 22, wherein crystallizing the amorphous silicon layer includes reacting nickel (Ni) with silicon so as to form silicide (NiSi$_2$).

24. The method of claim 23, wherein crystallizing the amorphous silicon layer includes applying heat to the amorphous silicon layer.

25. The method of claim 19, wherein the catalytic metal is lead (Pb) or cobalt (Co).

26. The method of claim 19, wherein the buffer layer includes at least one of silicon oxide and silicon nitride.

27. The method of claim 19, wherein the island pattern includes at least one of silicon oxide and silicon nitride.

28. The method of claim 19, wherein the first insulation layer includes at least one of silicon oxide, silicon nitride and tetra ethoxy silane (TEOS).

29. The method of claim 19, wherein the n-type ions are phosphorous ions.

30. The method of claim 29, wherein heat-treating the polycrystalline silicon layer includes reacting the phosphorus ions with the catalytic metal.

31. The method of claim 19, wherein heat-treating the polycrystalline silicon layer includes diffusing the catalytic metal out of the active region and reacting the catalytic metal with the n-type ions.

32. The method of claim 19, wherein applying a dopant to the second active areas of the island-shaped active layer includes doping with a B$_2$H$_6$ gas to the second active areas to form p-type source and drain regions.

33. The method of claim 19, wherein etching the exposed surface of the buffer layer includes forming a first buffer layer portion underneath the active layer and a second buffer layer portion on the remaining surface of the substrate, and wherein the first buffer layer portion is thicker than the second buffer layer portion.

34. The method of claim 19, wherein the etchant used in removing the island pattern etches the exposed surface of the buffer layer.

35. The method of claim 34, wherein the etchant includes hydrogen fluoride (HF).

36. The method of claim 19, wherein etching the exposed surface of the buffer layer includes extending an etching time for removing the island pattern to about 20% longer than a time period required for substantially removing the island pattern.

37. The method of claim 19, wherein the dosage of the n-type ions in the step of applying the n-type ions to the polycrystalline silicon layer is such that the subsequent heat treating removes substantially all catalytic metal from the active region underneath the island pattern.

38. The method of claim 19, wherein the dosage of the n-type ions is within a range of about $1 \times 10^{18}$ atoms/cm$^3$ to about $3 \times 10^{21}$ atoms/cm$^3$.

* * * * *